United States Patent
Kinoshita

(10) Patent No.: US 9,698,273 B2
(45) Date of Patent: Jul. 4, 2017

(54) THIN FILM TRANSISTOR, METHOD OF MANUFACTURING THE SAME, DISPLAY UNIT, AND ELECTRONIC APPARATUS

(71) Applicant: Sony Corporation, Tokyo (JP)

(72) Inventor: Tomoatsu Kinoshita, Tokyo (JP)

(73) Assignee: Joled Inc., Tokyo (JP)

(*) Notice: Subject to any disclaimer, the term of this patent is extended or adjusted under 35 U.S.C. 154(b) by 187 days.

(21) Appl. No.: 13/849,978

(22) Filed: Mar. 25, 2013

(65) Prior Publication Data

US 2013/0256798 A1    Oct. 3, 2013

(30) Foreign Application Priority Data

Mar. 30, 2012    (JP) .................. 2012-080642

(51) Int. Cl.
 *H01L 29/786* (2006.01)
 *H01L 29/66* (2006.01)
 *H01L 27/12* (2006.01)

(52) U.S. Cl.
 CPC ...... *H01L 29/7869* (2013.01); *H01L 27/1214* (2013.01); *H01L 29/66742* (2013.01)

(58) Field of Classification Search
 None
 See application file for complete search history.

(56) References Cited

U.S. PATENT DOCUMENTS

| | | |
|---|---|---|
| 2008/0237598 A1 | 10/2008 | Nakayama |
| 2010/0127266 A1 | 5/2010 | Saito et al. |
| 2010/0193784 A1* | 8/2010 | Morosawa .......... H01L 29/7869 257/43 |
| 2011/0180802 A1 | 7/2011 | Morosawa et al. |
| 2011/0198594 A1* | 8/2011 | Yamazaki ....... 257/57 |
| 2012/0074399 A1 | 3/2012 | Den Boer |
| 2012/0305925 A1* | 12/2012 | Misaki ............ 257/59 |
| 2013/0009219 A1* | 1/2013 | Yamazaki et al. ........ 257/288 |
| 2014/0034947 A1* | 2/2014 | Moriguchi et al. ....... 257/43 |

FOREIGN PATENT DOCUMENTS

| | | |
|---|---|---|
| JP | 02-275672 | 11/1990 |
| JP | 2007-194594 | 8/2007 |
| JP | 2009-212476 | 9/2009 |
| JP | 2010-114413 A | 5/2010 |
| JP | 2010-123748 A | 6/2010 |
| JP | 2011-187952 | 9/2011 |

OTHER PUBLICATIONS

Japanese Office Action issued Mar. 29, 2016 in corresponding Japanese Application No. 2012-080642.
Japanese Office Action issued Oct. 18, 2016 in corresponding Japanese application No. 2012-080642 (4 pages).

* cited by examiner

*Primary Examiner* — Whitney T Moore
*Assistant Examiner* — Scott R Wilson
(74) *Attorney, Agent, or Firm* — K&L Gates LLP

(57) ABSTRACT

A thin film transistor includes: a gate electrode and a pair of source-drain electrodes provided on a substrate; an oxide semiconductor layer provided between the gate electrode and the pair of source-drain electrodes, the oxide semiconductor layer forming a channel; a protection film provided over whole of a surface above the substrate; and a gate insulating film provided on a gate electrode side of the oxide semiconductor layer, the gate insulating film having end faces part or all of which are covered with the pair of source-drain electrodes or with the protection film.

9 Claims, 13 Drawing Sheets

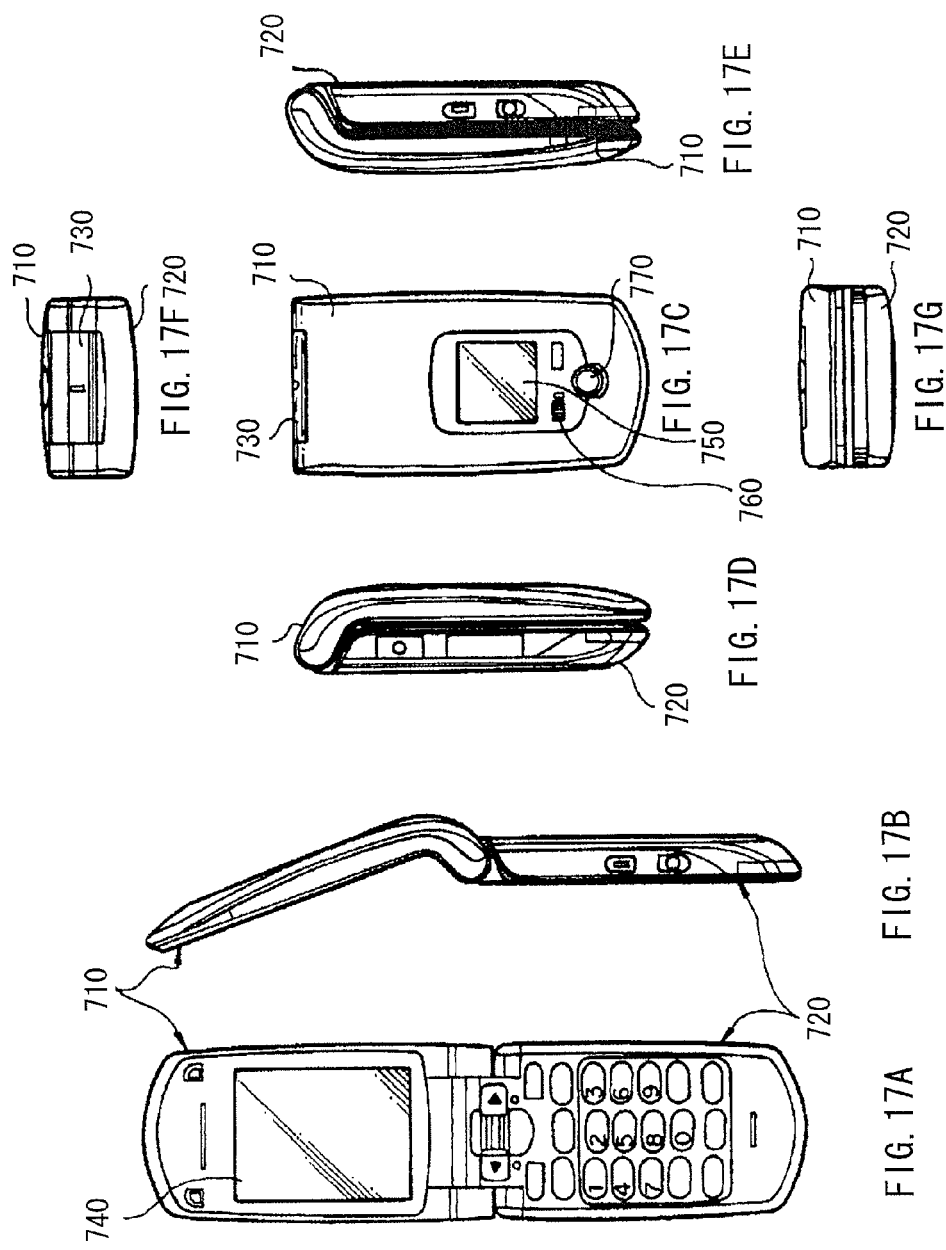

_(1)_

THIN FILM TRANSISTOR, METHOD OF MANUFACTURING THE SAME, DISPLAY UNIT, AND ELECTRONIC APPARATUS

CROSS REFERENCES TO RELATED APPLICATIONS

The present application claims priority to Japanese Priority Patent Application JP 2012-080642 filed in the Japan Patent Office on Mar. 30, 2012, the entire content of which is hereby incorporated by reference.

BACKGROUND

The present disclosure relates to a thin film transistor (TFT) that includes an oxide semiconductor layer as a channel and to a method of manufacturing the TFT. The present disclosure also relates to a display unit and an electronic apparatus that each include the TFT.

Recently, for the sake of application to, for example, a thin film transistor, a light emitting device, an electronic device such as a transparent conductive film, or the like, studies and development have been activated on an oxide semiconductor that is an oxide of zinc (Zn), indium (In), gallium (Ga), tin (Sn), or a mixture thereof. It has been known that such oxide semiconductors exhibit superior semiconductor characteristics.

For example, it has been known that, when the foregoing oxide semiconductors are used as an active layer (channel) of a TFT, high electron mobility and superior electric characteristics are obtained compared to in a case of using amorphous silicon which is usually used for devices such as an liquid crystal display. As an example of such a TFT using an oxide semiconductor layer, a bottom-gate or top-gate structure such as those disclosed in Japanese Unexamined Patent Application Publication No. 2007-194594 has been reported.

SUMMARY

However, oxide semiconductors are easily influenced by moisture and hydrogen, which causes an issue of unstable TFT characteristics.

It is desirable to provide a highly-reliable thin film transistor with stable TFT characteristics, a method of manufacturing the thin film transistor, a display unit, and an electronic apparatus.

According to an embodiment of the present disclosure, there is provided a thin film transistor including: a gate electrode and a pair of source-drain electrodes provided on a substrate; an oxide semiconductor layer provided between the gate electrode and the pair of source-drain electrodes, the oxide semiconductor layer forming a channel; a protection film provided over whole of a surface above the substrate; and a gate insulating film provided on a gate electrode side of the oxide semiconductor layer, the gate insulating film having end faces part or all of which are covered with the pair of source-drain electrodes or with the protection film.

According to an embodiment of the present disclosure, there is provided a method of manufacturing a thin film transistor, the method including: forming a gate electrode on a substrate; forming a gate insulating film over whole of a surface above the substrate and the gate electrode; forming an oxide semiconductor layer on the gate insulating film; removing part of the gate electrode to form an end face; forming a pair of source-drain electrodes from on the oxide semiconductor layer and to on the substrate; and forming a protection film over whole of a surface above the substrate.

According to an embodiment of the present disclosure, there is provided a method of manufacturing a thin film transistor, the method including: forming a gate electrode on a substrate; forming a gate insulating film over whole of a surface above the substrate and the gate electrode; forming an oxide semiconductor layer on the gate insulating film; removing part of the gate electrode to form an end face; forming a pair of source-drain electrodes on the oxide semiconductor layer; and forming a protection film that is in contact with the end face of the gate insulating film and covers whole of a surface above the substrate.

According to an embodiment of the present disclosure, there is provided a method of manufacturing a thin film transistor, the method including: forming an oxide semiconductor layer on a substrate; forming a gate insulating film on the oxide semiconductor layer; forming a gate electrode on the gate insulating film; forming a protection film from on the gate electrode and to on the substrate; and forming a pair of source-drain electrodes in a region where the gate electrode is not formed, the pair of source-drain electrodes being connected to the oxide semiconductor layer.

According to an embodiment of the present disclosure, there is provided a display unit with a plurality of display devices and a plurality of thin film transistors driving the display devices, the plurality of thin film transistors each including: a gate electrode and a pair of source-drain electrodes provided on a substrate; an oxide semiconductor layer provided between the gate electrode and the pair of source-drain electrodes, the oxide semiconductor layer forming a channel; a protection film provided over whole of a surface above the substrate; and a gate insulating film provided on a gate electrode side of the oxide semiconductor layer, the gate insulating film having end faces part or all of which are covered with the pair of source-drain electrodes or with the protection film.

According to an embodiment of the present disclosure, there is provided an electronic apparatus with a display unit with a plurality of display devices and a plurality of thin film transistors driving the display devices, the plurality of thin film transistors each including: a gate electrode and a pair of source-drain electrodes provided on a substrate; an oxide semiconductor layer provided between the gate electrode and the pair of source-drain electrodes, the oxide semiconductor layer forming a channel; a protection film provided over whole of a surface above the substrate; and a gate insulating film provided on a gate electrode side of the oxide semiconductor layer, the gate insulating film having end faces part or all of which are covered with the pair of source-drain electrodes or with the protection film.

In the thin film transistor, the method of manufacturing the thin film transistor, the display unit, and the electronic apparatus according to the embodiments of the present disclosure, the end face of the gate insulating film provided on the gate electrode side of the oxide semiconductor layer is covered with the source-drain electrode or with the protection film, and thereby, intrusion of moisture, hydrogen, etc. into the gate insulating film is suppressed.

According to the thin film transistor, the method of manufacturing the thin film transistor, the display unit, and the electronic apparatus according to the embodiments of the present disclosure, the end face of the gate insulating film provided in contact with the oxide semiconductor layer is covered with the source-drain electrode or with the protection film. This suppresses intrusion of moisture, hydrogen, etc. into the oxide semiconductor layer through the gate insulating film. Therefore, it is possible to improve stability of characteristics and to improve reliability.

Additional features and advantages are described herein, and will be apparent from the following Detailed Description and the figures.

BRIEF DESCRIPTION OF THE FIGURES

The accompanying drawings are included to provide a further understanding of the disclosure, and are incorporated in and constitute a part of this specification. The drawings illustrate embodiments and, together with the specification, serve to explain the principles of the application.

FIGS. 17A and 17B are a front view and a side view of Application Example 5 in an open state, respectively, and FIGS. 17C to 17G are a front view, a left side view, a right side view, a top view, and a bottom view of Application Example 5 in a closed state, respectively.

DETAILED DESCRIPTION

Hereinafter, preferred embodiments of the present disclosure will be described in detail with reference to the drawings. Description will be given in the following order.

[Bottom-Gate Type TFT]
1. First Embodiment (an example in which a top face and end faces of a gate insulating film are covered with a metal film)
 1-1. Configuration of TFT
 1-2. Method of Manufacturing TFT
 1-3. General Configuration of Display Unit
 1-4. Functions and Effects
2. Modifications
 2-1. Modification 1 (an example in which a top face and end faces of a gate insulating film are covered with a protection film)
 2-2. Modification 2 (an example in which a top face and end faces of a gate insulating film are covered with a metal film and a protection film)
[Top-Gate Type TFT]
3. Second Embodiment (an example in which end faces of a gate insulating film are covered with a protection film)
4. Application Examples 1. First Embodiment

[1-1. Configuration of Thin Film Transistor]

Figure 1A:
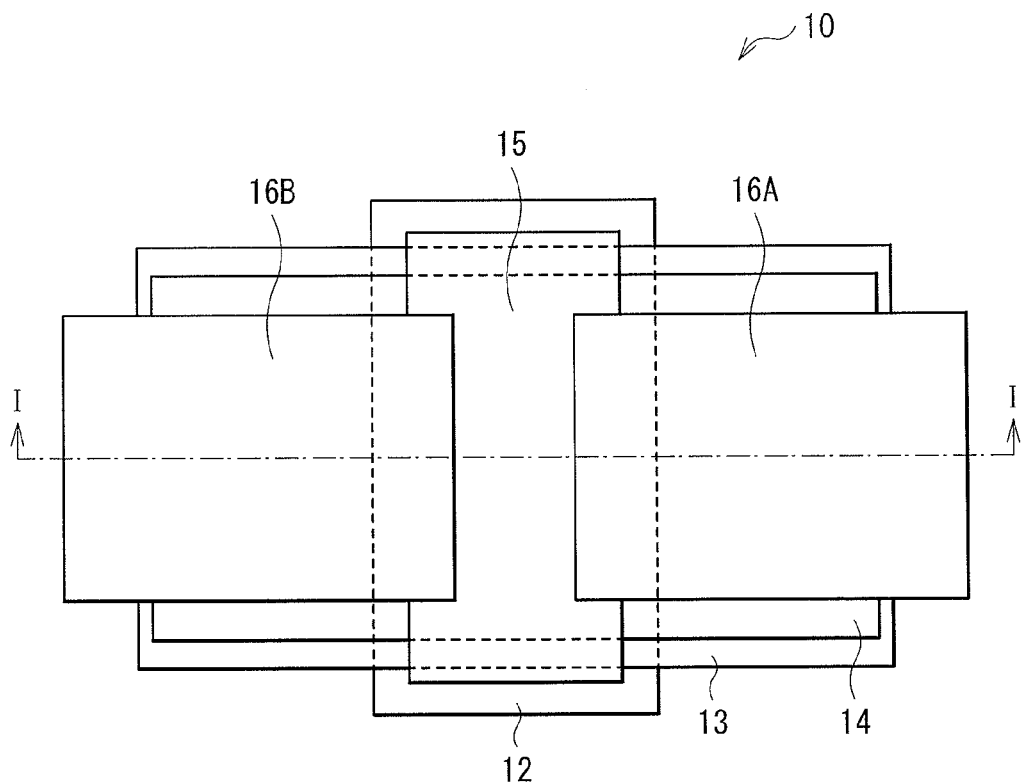
FIG. 1A is a planar view illustrating an example of a configuration of a thin film transistor (TFT) according to a first embodiment of the present disclosure.
Figure 1B:
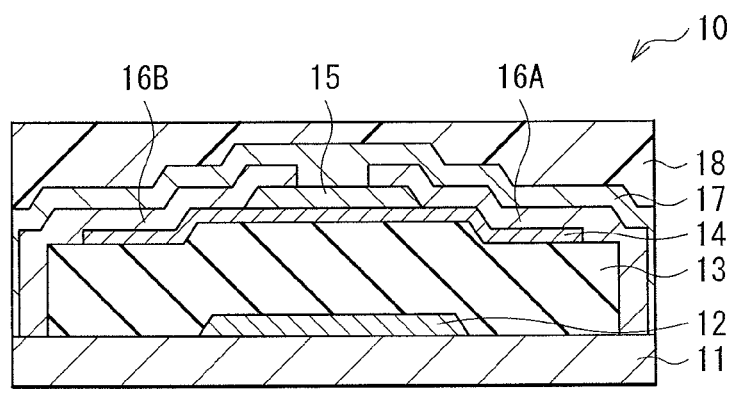
FIG. 1B is a cross-sectional view of the TFT shown in FIG. 1A.

FIG. 1A illustrates a planar configuration of a thin film transistor (TFT) 10 according to a first embodiment of the present application. FIG. 1B illustrates a cross-sectional configuration of the TFT 10 taken along a dashed line I-I in FIG. 1A. The TFT 10 is a so-called bottom-gate type (inverted staggered structure) TFT and uses an oxide semiconductor as a channel (active layer). The TFT 10 includes a gate electrode 12, a gate insulating film 13, an oxide semiconductor layer 14, a channel protection film 15, source-drain electrodes 16A and 16B, and a protection film 17 that are formed in this order on a substrate 11 made of a material such as glass. In the TFT 10 according to the present embodiment, the gate insulating film 13 is formed in an island-like shape and two end faces thereof that face each other with the gate electrode 12 in between are covered with the source-drain electrodes 16A and 16B.

The gate electrode 12 has a role of controlling carrier density (electron density, in this example) in the oxide semiconductor layer 14 with use of a gate voltage applied to the TFT 10. The gate electrode 12 may be configured, for example, of a single layer film made of one of materials such as molybdenum (Mo), aluminum (Al), and an aluminum alloy, or of a lamination film made of two or more thereof. It is to be noted that examples of the aluminum alloy include an aluminum-neodymium alloy. Other than the foregoing films, an electrically-conductive oxide film made of a material such as ITO (indium-tin oxide) may be used.

The gate insulating film 13 is configured of a single film made of one of films such as a silicon oxide film, a silicon nitride film, a silicon nitride oxide film, and an aluminum oxide film, or of a lamination film made of two or more thereof. In this example, the gate insulating film 13 is separated between the adjacent TFTs and is patterned in an island-like shape as described later in detail. The gate insulating film 13 may have a thickness, for example, from 200 nm to 300 nm both inclusive.

The oxide semiconductor layer 14 may include, as a main component, an oxide of one or more of elements such as indium (In), gallium (Ga), zinc (Zn), tin (Sn), Al, and titanium (Ti), for example. The oxide semiconductor layer 14 forms a channel between the source-drain electrodes 16A and 16B in response to gate voltage application. The oxide semiconductor layer 14 preferably has a thickness in a degree that does not cause degradation in an ON current of the TFT. Specifically, it is preferable that the oxide semiconductor layer 14 have a thickness, for example, from 5 nm to 100 nm both inclusive.

The channel protection film 15 is formed on the oxide semiconductor layer 14. The channel protection film 15 suppresses damage in the channel upon forming the source-drain electrodes 16A and 16B. The channel protection film 15 may be formed, for example, of a metal oxide such as an aluminum oxide, and may have a thickness, for example, from 10 nm to 300 nm both inclusive.

The source-drain electrodes 16A and 16B may each be formed, for example, of a single film made of one of materials such as molybdenum, aluminum, copper (Cu), Ti, ITO, and titanium oxide, or of a lamination film made of two or more thereof. It is preferable to use, for example, a trilayer film in which, for example, Ti, Al, and Ti, with thickness of, for example, 50 nm, 500 nm, and 50 nm, respectively, are laminated, or to use metal or a metal compound that is weak in bonding with oxygen, for example, a metal compound including oxygen such as ITO and titanium oxide. Accordingly, electric characteristics of the oxide semiconductor are stably retained.

In the present embodiment, the source-drain electrodes 16A and 16B are each patterned to extend to the outside of the gate insulating film 13 and are so formed as to cover part or all of a pair of end faces that face each other. This suppresses intrusion of moisture, hydrogen, etc. from the outside into the gate insulating film 13 during the manufacturing process and after the manufacture.

The protection film 17 may be configured, for example, of a single film such as an aluminum oxide film and a silicon oxide film, or of a lamination film including an aluminum oxide film and a silicon oxide film. The protection film 17 may have a thickness, for example, from 10 nm to 100 nm both inclusive, preferably, 50 nm or less.

A planarization film 18 planarizes asperities on the substrate 11 resulting from provision of components such as the TFT 10. The planarization film 18 may be made, for example, of an organic material such as acryl, polyimide, and novolac.

[1-2. Method of Manufacturing Thin Film Transistor 10]

FIGS. 2A to 2H are diagrams for explaining a method of manufacturing the TFT 10. The TFT 10 may be manufactured as follows, for example.

Figure 2A:
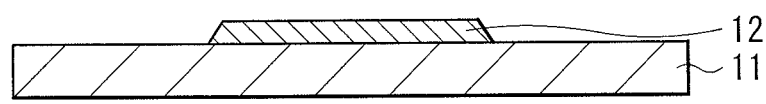
FIG. 2A is a cross-sectional view illustrating a step of manufacturing the TFT shown in FIGS. 1A and 1B.

First, a metal film is formed with, for example, a thickness of 180 nm on an entire surface of the substrate 11 by a method such as sputtering and deposition as shown in FIG. 2A. Next, the metal thin film is patterned by a method such as photolithography and etching to form the gate electrode 12.

Figure 2B:
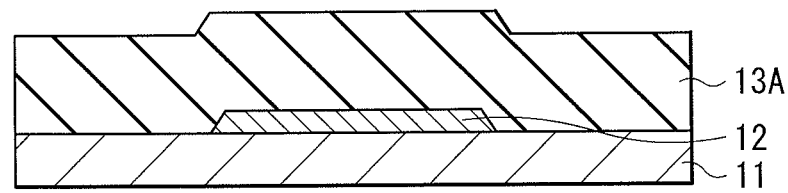
FIG. 2B is a cross-sectional view of a step following the step shown in FIG. 2A.
Figure 2C:
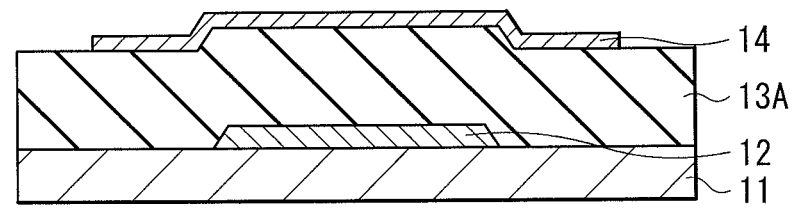
FIG. 2C is a cross-sectional view of a step following the step shown in FIG. 2B.

Subsequently, the insulating layer 13A is so formed, for example, by a plasma CVD method as to cover the substrate 11 and the gate electrode 12, as shown in FIG. 2B. Subsequently, the oxide semiconductor layer 14 is formed, for example, by sputtering as shown in FIG. 2C. Specifically, when indium-gallium-zinc oxide (IGZO) is used as the oxide semiconductor, DC sputtering is performed using a ceramic of IGZO as a target. At this time, for example, in a DC sputtering apparatus, air in a vacuum container is exhausted until the vacuum level thereof becomes, for example, $1 \times 10^{-4}$ Pa or less and then, mixture gas of argon (Ar) and oxygen may be introduced to perform plasma electric discharge. Further, carrier density of the channel is controllable by adjusting a flow ratio of argon and oxygen in the foregoing mixture gas.

Alternatively, when a zinc oxide is used as the oxide semiconductor, RF sputtering may be performed using a ceramic of zinc oxide as a target, or DC sputtering may be performed using zinc as a target in mixture gas atmosphere including argon and oxygen. Subsequently, the formed oxide semiconductor layer 14 is patterned in a preferable shape, for example, by photolithography.

Figure 2D:
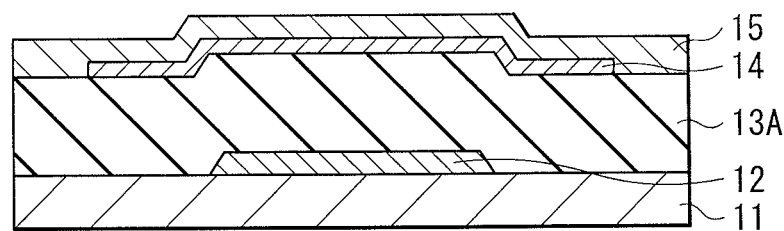
FIG. 2D is a cross-sectional view of a step following the step shown in FIG. 2C.
Figure 2E:
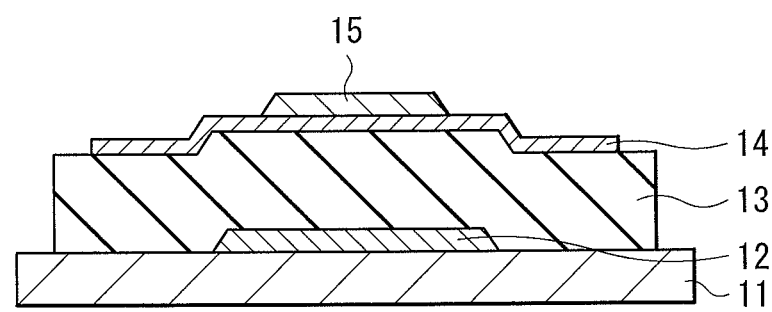
FIG. 2E is a cross-sectional view of a step following the step shown in FIG. 2D.

Subsequently, as shown in FIG. 2D, for example, a silicon oxide film may be formed on the formed oxide semiconductor layer 14 by a CVD method, and the silicon oxide film may be patterned in an island-like shape by photolithography and etching to form the channel protection film 15. It is to be noted that a step of supplying oxygen to the oxide semiconductor layer 14 with use of, for example, dinitrogen monoxide plasma, oxygen plasma, etc. may be additionally provided before forming the channel protection film 15. Subsequently, as shown in FIG. 2E, the formed channel protection film 15 is patterned in a preferable shape, for example, by photolithography, and thereafter, the insulating layer 13A is patterned in an island-like shape, for example, by photolithography and etching to form the gate insulating film 13.

Figure 2F:
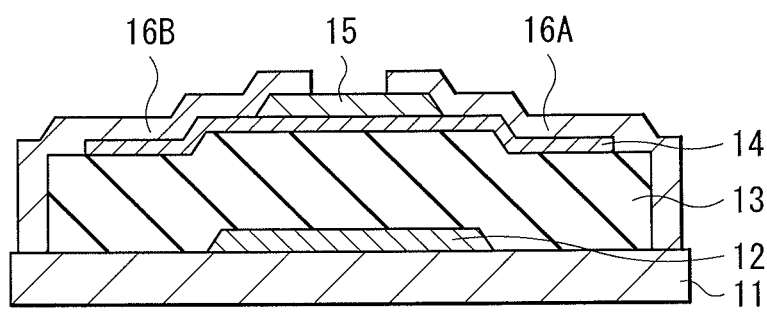
FIG. 2F is a cross-sectional view of a step following the step shown in FIG. 2E.
Figure 3:
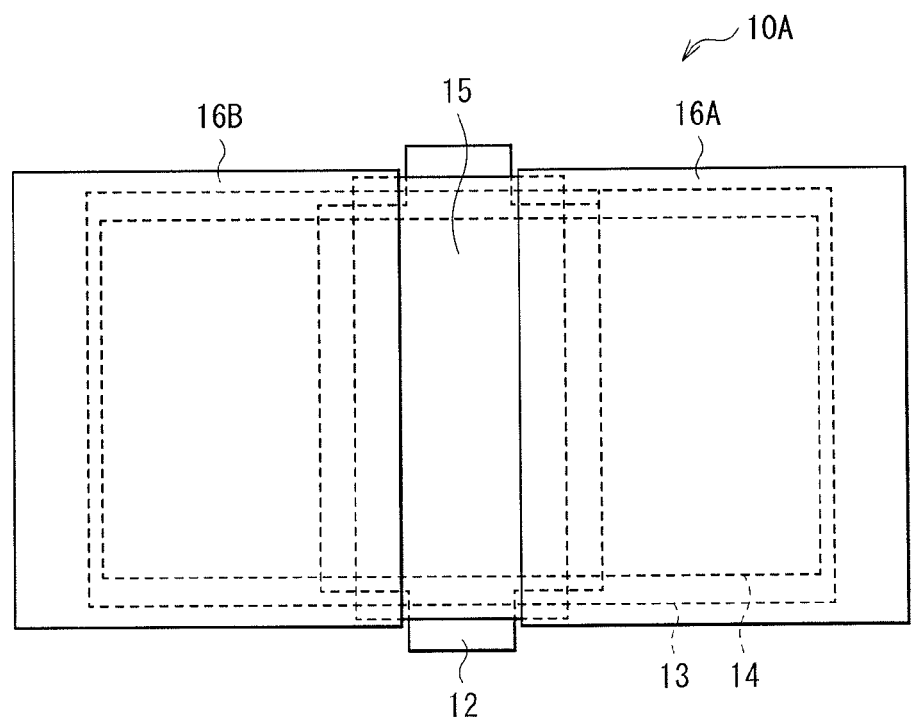
FIG. 3 is a planar view illustrating another example of the configuration of the TFT according to the first embodiment of the present disclosure.

Subsequently, as shown in FIG. 2F, a metal thin film in which, for example, Ti, Al, and Ti are laminated in this order is formed, for example, by sputtering on the substrate 11 so that the metal thin film covers from the oxide semiconductor layer 14 and the channel protection film 15 to the end faces of the gate insulating film 13. Subsequently, the formed metal thin film is patterned, for example, by wet etching with use of mixture including phosphoric acid, nitric acid, and acetic acid. At this time, the channel protection film 15 protects a surface (channel surface) of the oxide semiconductor layer 14. This suppresses damaging the oxide semiconductor layer 14 by etching. Thus, each of the source-drain electrodes 16A and 16B is formed. It is to be noted that, although the source-drain electrodes 16A and 16B are so formed as to cover the pair of end faces, of the gate insulating film 13, that face each other with the gate electrode 12 in between, this is not limitative. Alternatively, for example, a portion, of the gate electrode 12, that is exposed from the channel protection film 15 may be processed and the source-drain electrodes 16A and 16B may be so formed as to cover whole of the end faces of the gate insulating film 13, as shown in FIG. 3. Intrusion of moisture, hydrogen, etc. from the outside air into the gate insulating film 13 is suppressed by thus covering the whole of the end faces of the gate insulating film 13 with the metal film.

Figure 2G:
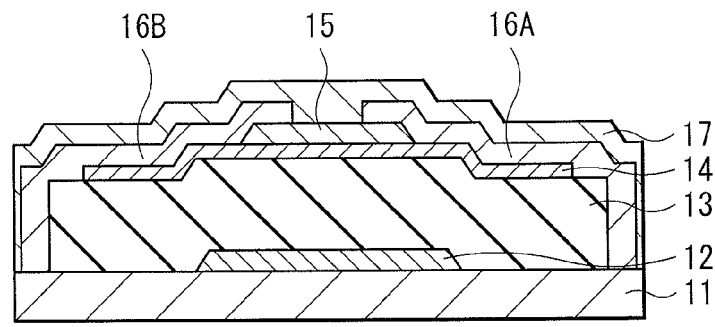
FIG. 2G is a cross-sectional view of a step following the step shown in FIG. 2F.
Figure 2H:
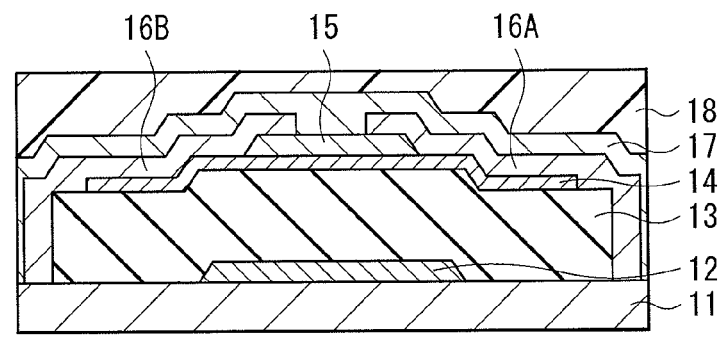
FIG. 2H is a cross-sectional view of a step following the step shown in FIG. 2G.

Subsequently, for example, an aluminum oxide film may be formed as the protection film 17 on the source-drain electrodes 16A and 16B, for example, by sputtering or by an atomic layer deposition (ALD) method, as shown in FIG. 2G. Subsequently, the resultant is processed, for example, for two hours under atmosphere at 300° C. including oxygen and nitrogen at a ratio of 40:60, and thereby, oxygen is supplied to a channel region of the oxide semiconductor layer 14. Lastly, for example, polyimide may be applied on the protection film 17 by spin coating and the resultant is baked to form the planarization film 18 as shown in FIG. 2H. Thus, the TFT 10 shown in FIGS. 1A and 1B is completed.

[1-3. General Configuration of Display Unit]

Figure 4:
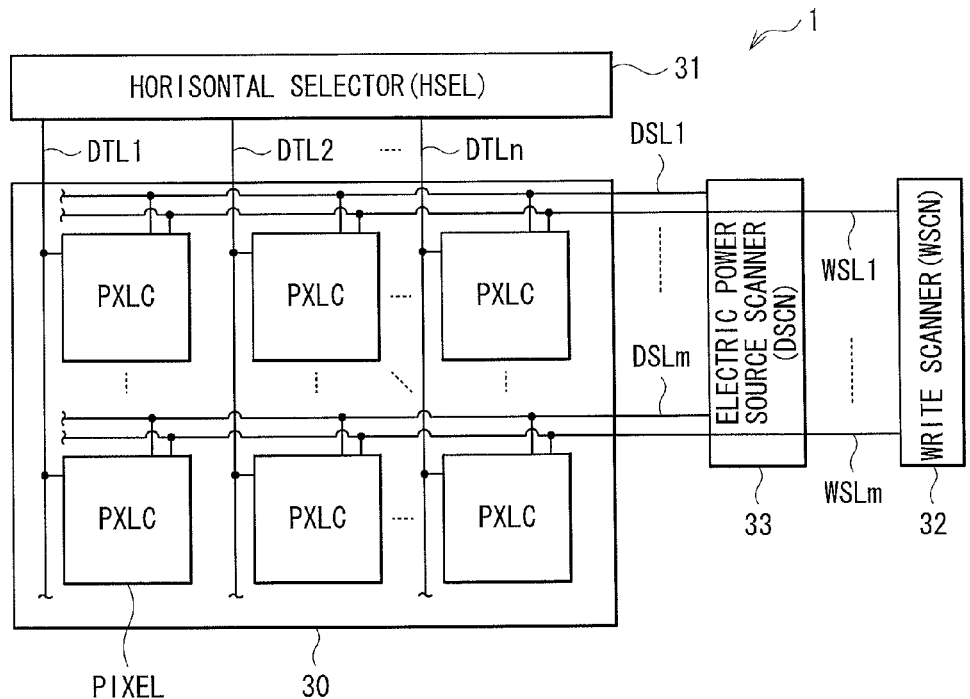
FIG. 4 is a block diagram illustrating a configuration example of a display unit with a TFT according to an embodiment of the present disclosure.

Next, description will be given of an example of a display unit that includes the above-described TFT 10 with reference to FIGS. 4 and 5. FIG. 4 illustrates a configuration of a display unit 1 that is used as an ultra-thin organic electroluminescence (EL) color display. The display 1 may include, for example, a display region 30 that includes pixels PXLC configured of a plurality of organic EL elements as display elements and arranged in a matrix, on the substrate 11 provided with the TFT 10. A horizontal selector (HSEL) 31 that is a signal section, and a write scanner (WSCN) 32 and an electric power source scanner (DSCN) 33 that are scanner sections are formed around the display region 30.

In the display region 30, signal lines DTL1 to DTLn are arranged in a column direction, and scanning lines WSL1 to WSLm and electric power source lines DSL1 to DSLm are arranged in a row direction. A pixel circuit 40 that includes the pixel PXLC (one of red, blue, and green pixels (sub-pixels)) is provided at each intersection of the signal line DTL and the scanning line WSL. Each signal line DTL is connected to the horizontal selector 31. The horizontal selector 31 supplies an image signal to the signal line DTL. Each scanning line WSL is connected to the write scanner 32. Each electric power source line DSL is connected to the electric power source scanner 33.

In the present embodiment, the gate insulating film 13 in the TFT 10 is separated between the adjacent TFTs and is formed in an island-like shape. Specifically, the gate insulating film 13 is not formed in a region other than regions of the transistor section TFT (3A and 3B) and of the capacitor section CS (3C), and is formed for each TFT 10, as shown in FIG. 6. It is to be noted that FIG. 6 is an example that schematically illustrates the pixel circuit 40 shown in FIG. 5.

Figure 5:
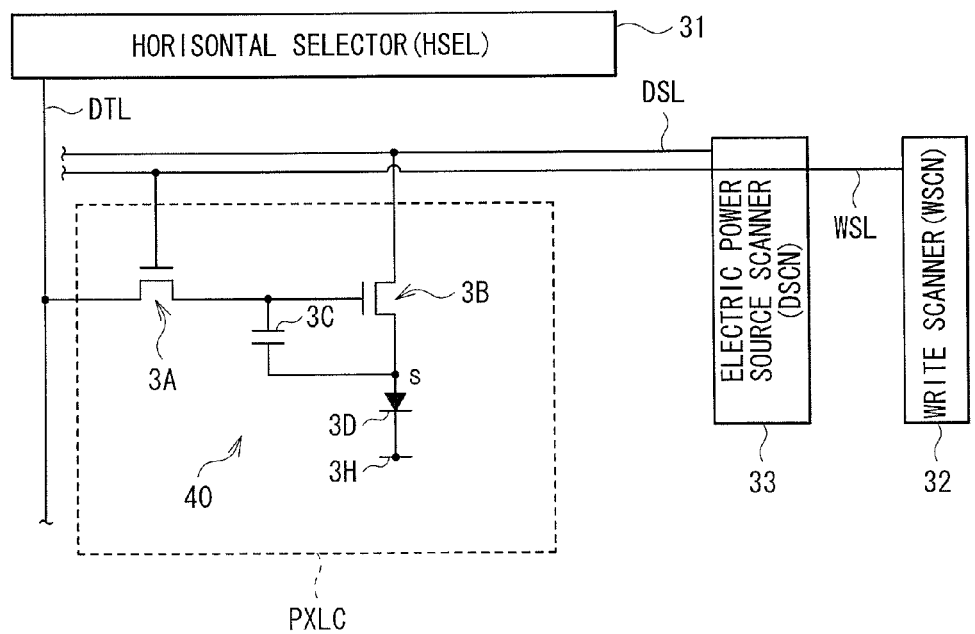
FIG. 5 is a circuit diagram illustrating a detailed configuration example of a pixel shown in FIG. 4.
Figure 6:
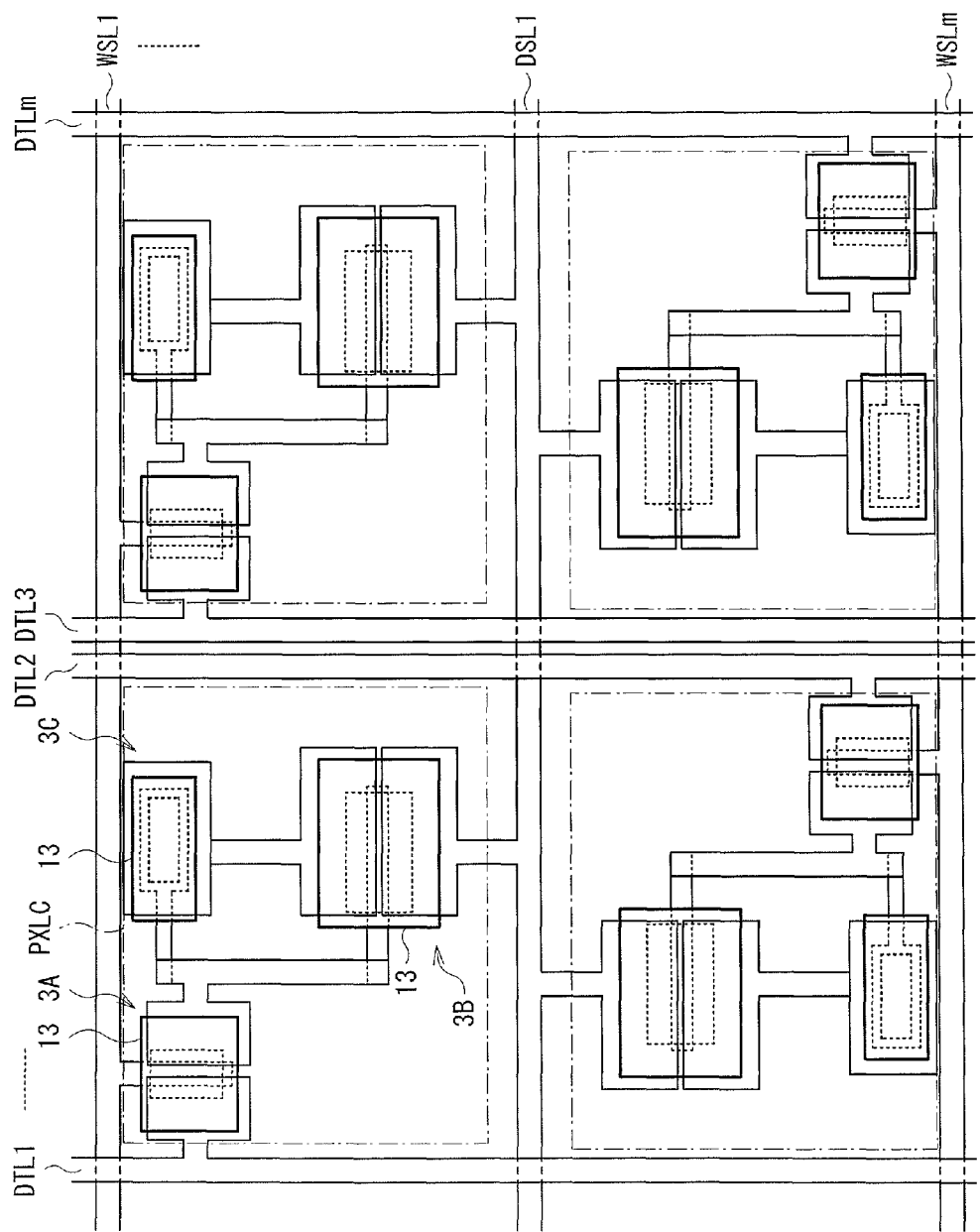
FIG. 6 is a schematic view illustrating a configuration of the display unit shown in FIG. 4.

FIG. 5 illustrates an example of the pixel circuit 40. The pixel circuit 40 is an active drive circuit that includes a sampling transistor 3A, a driving transistor 3B, a retention capacitor 3C, and a light emitting element 3D configuring the pixel PXLC. The transistors 3A and 3B are each configured of the TFT 10 of the above-described embodiment of the present disclosure.

The sampling transistor 3A is connected to the scanning line WSL1 corresponding to a gate thereof. One of a source and a drain of the sampling transistor 3A is connected to the signal line DTL1 corresponding thereto. The other of the source and the drain of the sampling transistor 3A is connected to a gate g of the driving transistor 3B. A drain d of the driving transistor 3B is connected to the electric power source line DSL1 corresponding thereto. A source s of the driving transistor 3B is connected to an anode of the light emitting element 3D. A cathode of the light emitting element 3D is connected to the ground line 3H. It is to be noted that the ground line 3H is arranged to be shared by all of the pixels PXLC. The retention capacitor 3C is connected between the source s and the gate g of the driving transistor 3B.

The sampling transistor 3A becomes electrically conductive in response to a control signal supplied from the scanning line WSL1. The sampling transistor 3A samples a signal potential of the image signal supplied from the signal line DTL1 and retains the sampled signal potential in the retention capacitor 3C. The driving transistor 3B receives a current supplied from the electric power source line DSL1 which is at a first potential and supplies a drive current to the light emitting element 3D according to the signal potential retained in the retention capacitor 3C. The light emitting element 3D emits light at luminance according to the signal potential of the image signal in response to the supplied drive current.

In the display unit 1, the sampling transistor 3A becomes electrically conductive in response to the control signal supplied from the scanning line WSL. The signal potential of the image signal supplied from the signal line DTL is sampled and is held in the retention capacitor 3C. Further, the electric power source line DSL that is at the first potential supplies a current to the driving transistor 3B and the driving transistor 3B supplies a drive current to the light emitting device 3D (each of the organic EL devices of red, blue, and green) according to the signal potential retained in the retention capacitor 3C. Each light emitting device 3D emits light with luminance according to the signal potential of the image signal in response to the supplied drive current.

[1-4. Functions and Effects]

Next, description will be given of functions and effects of the TFT 10 of the present embodiment in comparison to an existing example.

Figure 7A:
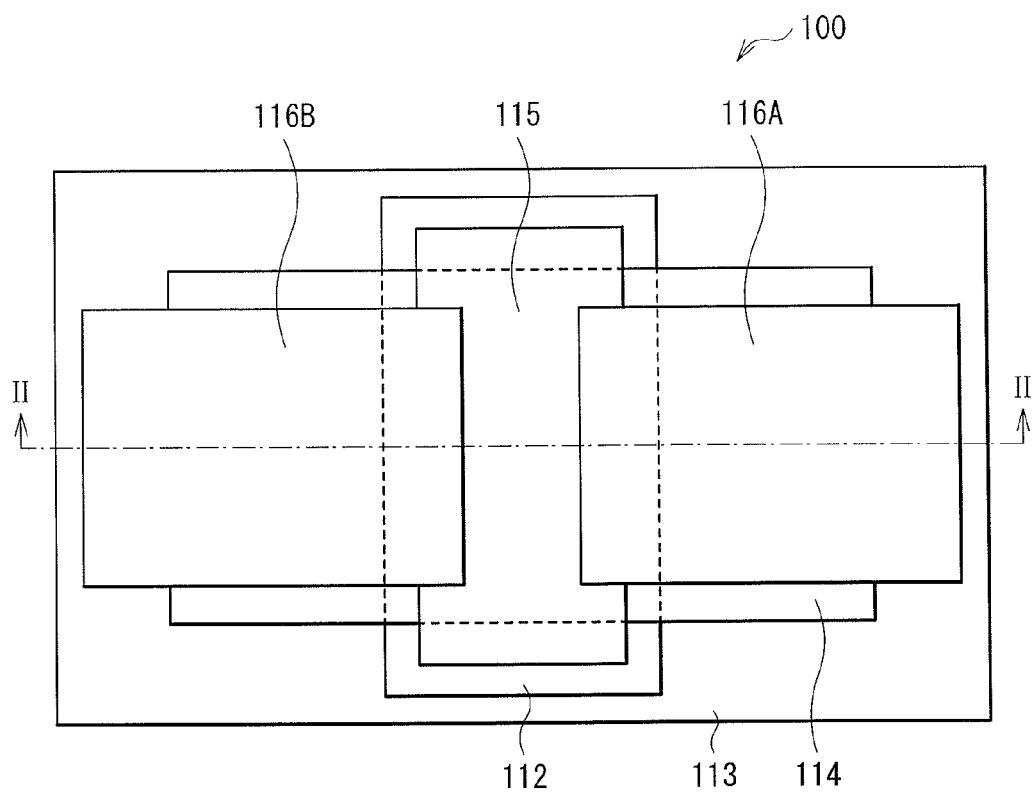
FIG. 7A is a planar view illustrating a configuration of a TFT according to an existing example.
Figure 7B:
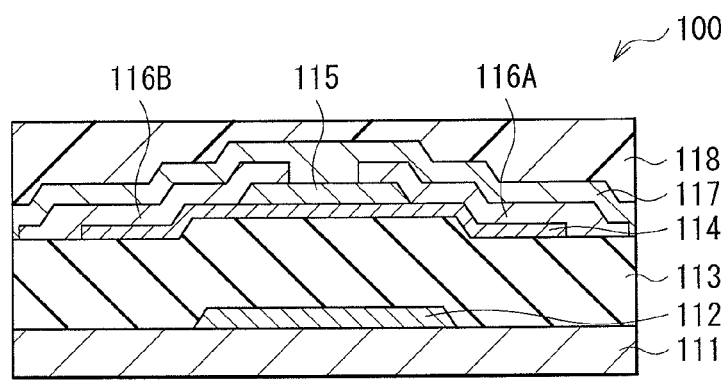
FIG. 7B is a cross-sectional view of the TFT shown in FIG. 7A.

FIG. 7A illustrates a planar configuration of a thin film transistor (TFT) 100 that has already been in use. FIG. 7B illustrates a cross-sectional configuration of the TFT 100 taken along a dashed line II-II in FIG. 7A. The TFT 100 includes, as the TFT 10 in the above-described embodiment, a gate electrode 112, a gate insulating film 113, an oxide semiconductor layer 114, a channel protection film 115, source-drain electrodes 116A and 116B, a protection film 117, and a planarization film 118 that are laminated in order from a substrate 111. In the TFT 100, the gate insulating film 113 is formed on an entire surface of the substrate 111 as shown in FIGS. 7A and 7B.

In the TFT 100, the oxide semiconductor layer 114 is in contact with the gate insulating film 113 and the channel protection film 115 that are each configured of a metal oxide. The gate insulating film 113 and the channel protection film 115 usually include moisture, hydrogen, etc. and hydrogen is diffused from the gate insulating film 113 and the channel protection film 115 into the oxide semiconductor layer 114 due to a heat treatment and a plasma treatment during manufacturing processes. Further, moisture, hydrogen, etc. included in the outside air are diffused from an upper portion of the TFT 100 into the oxide semiconductor layer 114, after manufacturing the TFT 100. Hydrogen functions as a donor. Therefore, a threshold voltage of the oxide semiconductor decreases. Accordingly, the TFT 100 performs depression-type operations in which a leakage current increases and finally performs conductive operations. In other words, there may have been an issue of variation in characteristics of the transistor and of lowered reliability of the transistor.

On the other hand, in the TFT 10 of the present embodiment, the gate insulating film 13 that functions as a path to supply moisture, hydrogen, etc. to the oxide semiconductor layer 14 is separated between adjacent transistors and an unnecessary part of the gate insulating film 13 is removed. In other words, the gate insulating film 13 is formed only on the transistor sections TFT (3A and 3B) and the capacitor section CS (3C) and part or all of the end faces of the gate insulating film 13 is covered with a metal layer that is the source-drain electrodes 16A and 16B in this example. An amount of hydrogen that is diffused from the gate insulating film 13 into the oxide semiconductor layer 14 decreases during the manufacturing processes of the TFT 10 by forming the gate insulating film 13 in an island-like shape in the above-described manner. Moreover, diffusion of moisture and hydrogen included in the outside air into the oxide semiconductor layer 14 through the planarization film 18 and the protection film 17 after the manufacture is suppressed for the following reason. In the present embodiment, the gate insulating film 13 is covered with the source-drain electrodes 16A and 16B. Therefore, an area of the gate insulating film 13 in contact with the protection film 17 and the planarization film 18 is small. Therefore, intrusion of moisture etc. from the outside air into the oxide semiconductor layer 14 after the manufacture is suppressed. In particular, the intrusion of moisture etc. into the oxide semiconductor layer 14 is suppressed by covering the whole of the end faces of the gate insulating film 13 with the source-drain electrodes 16A and 16B as shown in FIG. 3. It is to be noted that moisture, hydrogen, etc. diffused into the planarization film 18 and the protection film 17 arrive at the substrate 11. However, the substrate 11 passes little moisture or hydrogen. Therefore, moisture, hydrogen, etc. are not diffused into the oxide semiconductor layer 14 through the substrate 11.

As described above, according to the TFT 10 and the method of manufacturing the TFT 10 of the present embodiment, an amount of diffusion of hydrogen included in the gate insulating film 13 into the oxide semiconductor layer 14 is decreased by forming the gate insulating film 13 in an island-like shape. Also, diffusion of moisture, hydrogen, etc. included in the outside air into the oxide semiconductor layer 14 is suppressed by covering the end faces of the gate insulating film 13 with the source-drain electrodes 16A and 16B.

Accordingly, in the TFT 10 and the method of manufacturing the TFT 10 of the present embodiment, intrusion of moisture and hydrogen into the oxide semiconductor layer 14 during the manufacturing processes and after the manufacture is decreased. Therefore, the characteristics of the transistor are stabilized and degradation in the characteristics is suppressed. Accordingly, it is possible to provide a display unit with high reliability.

2. Modifications

Next, description will be given of thin film transistors (thin film transistors 10A and 10B) according to modifications (Modifications 1 and 2) of the TFT 10 of the above-described first embodiment. It is to be noted that components similar to those in the TFT 10 of the above-described first embodiment are designated with the same numerals and descriptions thereof will be omitted as appropriate.

[2-1. Modification 1]

Figure 8:
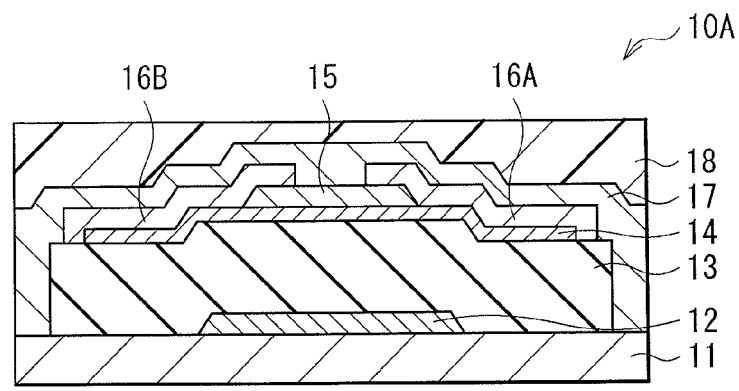
FIG. 8 is a cross-sectional view illustrating a configuration of a TFT according to Modification 1 of the embodiment of the present disclosure.

FIG. 8 illustrates a cross-sectional configuration of the thin film transistor (TFT) 10A according to Modification 1 of the embodiment of the present application. The TFT 10A is a TFT of a bottom-gate type as the TFT 10 of the above-described first embodiment, and uses an oxide semiconductor as a channel. Modification 1 is different from the above-described embodiment in that a top face of the gate insulating film 13 formed in an island-like shape is covered with the source-drain electrodes 16A and 16B and the protection film 17.

The TFT 10A may be configured with materials similar to those in the above-described embodiment. However, it is preferable to use an aluminum oxide film with higher density (for example, 2.82 g/cm$^3$ or higher) as a material of the protection film 17. An aluminum oxide has permeability of moisture, hydrogen, etc. that varies according to the density thereof and obtains superior gas barrier functions when the density is high.

[2-2. Modification 2]

Figure 9:
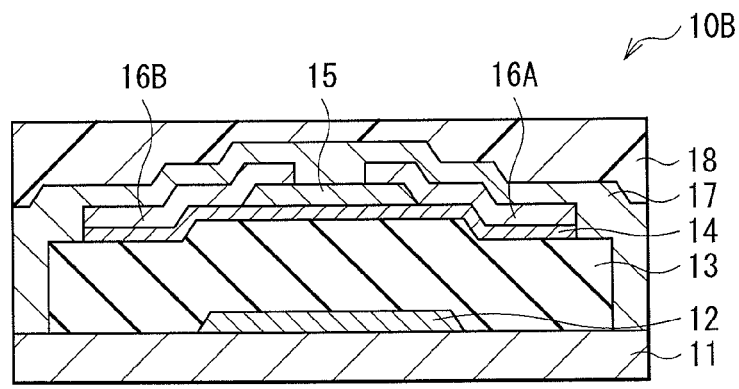
FIG. 9 is a cross-sectional view illustrating a configuration of a TFT according to Modification 2 of the embodiment of the present disclosure.

FIG. 9 illustrates a cross-sectional configuration of the thin film transistor (TFT) 10B according to Modification 2 of the embodiment of the present application. The TFT 10B is a TFT of a bottom-gate type as the TFT 10 of the above-described first embodiment, and uses an oxide semiconductor as a channel. Modification 2 is different from the above-described embodiment in that whole of a surface including the end faces and the top face of the gate insulating film 13 formed in an island-like shape are covered with the protection film 17.

The TFT 10B of Modification 2 provides, in addition to the effects of the above-described embodiment, an effect of decreasing the size of the planar shape of the TFT 10B since the source-drain electrodes 16A and 16B are allowed to be small.

3. Second Embodiment

Figure 10:
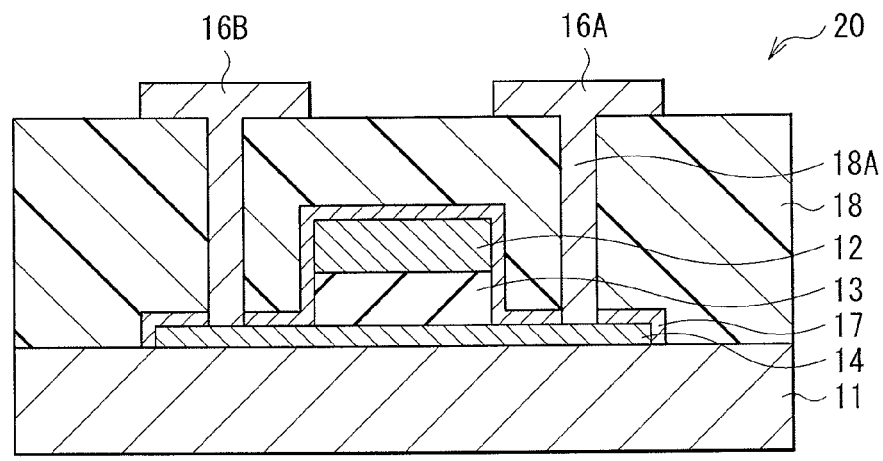
FIG. 10 is a cross-sectional view illustrating a configuration of a TFT according to a second embodiment of the present disclosure.

FIG. 10 illustrates a cross-sectional configuration of a thin film transistor (TFT) 20 according to a second embodiment of the present application. The TFT 20 is a TFT of a so-called top-gate type (staggered structure) and uses an oxide semiconductor as a channel. The TFT 20 includes the oxide semiconductor layer 14, the gate insulating film 13, the gate electrode 12, the protection film 17, and the planarization film 18 that are formed in this order on the substrate made of a material such as glass. The source-drain electrodes 16A and 16B are formed on the planarization film 18 and are connected to the oxide semiconductor layer 14 through thorough holes 18A that run through the planarization film 18 in a lamination direction.

Figure 11A:
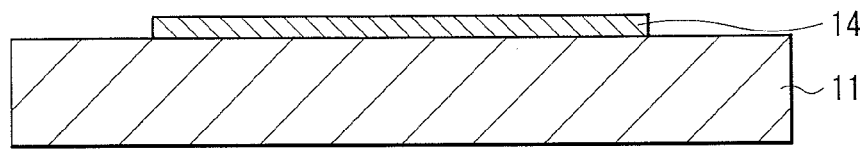
FIG. 11A is a cross-sectional view illustrating a step of manufacturing the TFT shown in FIG. 10.
Figure 11B:
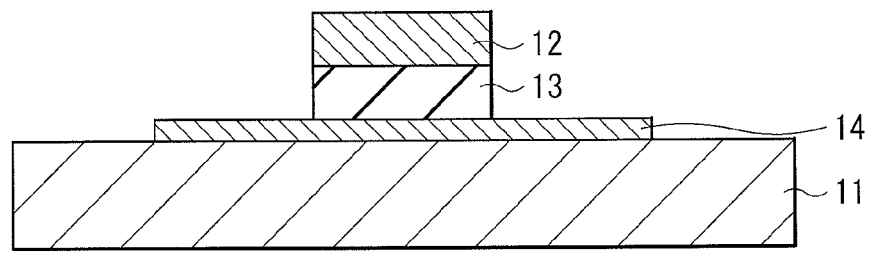
FIG. 11B is a cross-sectional view illustrating a step following the step shown in FIG. 11A.

In the present embodiment, the TFT 20 may be manufactured as follows, for example. First, as shown in FIG. 11A, an oxide semiconductor film is formed on the substrate 11, for example, by sputtering and then, the oxide semiconductor film is patterned by photolithography to form the oxide semiconductor layer 14. Subsequently, as shown in FIG. 11B, an insulating layer 13A and a metal layer 12A that are formed, for example, by sputtering, and the insulating layer 13A and the metal layer 12A are patterned in preferable shapes by photolithography to form the gate insulating film 13 and the gate electrode 12.

Figure 11C:
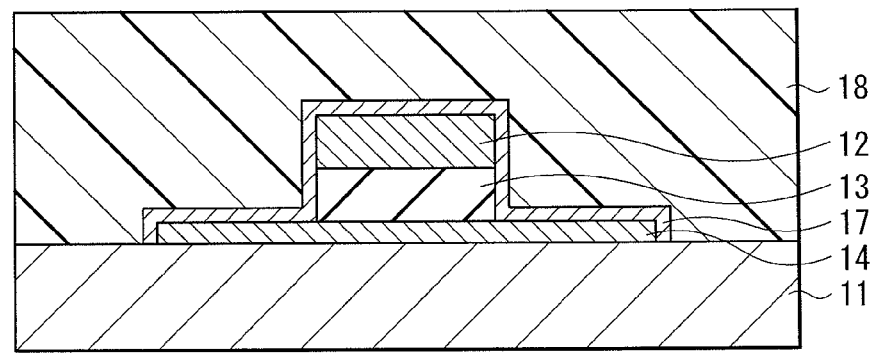
FIG. 11C is a cross-sectional view illustrating a step following the step shown in FIG. 11B.

Next, as shown in FIG. 11C, for example, an aluminum oxide film functioning as the protection film 17 is formed by a method such as sputtering and an ALD method on the surface of the oxide semiconductor layer 14, the gate insulating film 13, and the gate electrode 12. Subsequently, for example, polyimide is applied by spin coating on the protection film 17, and the applied polyimide is baked to form the planarization film 18.

Figure 11D:
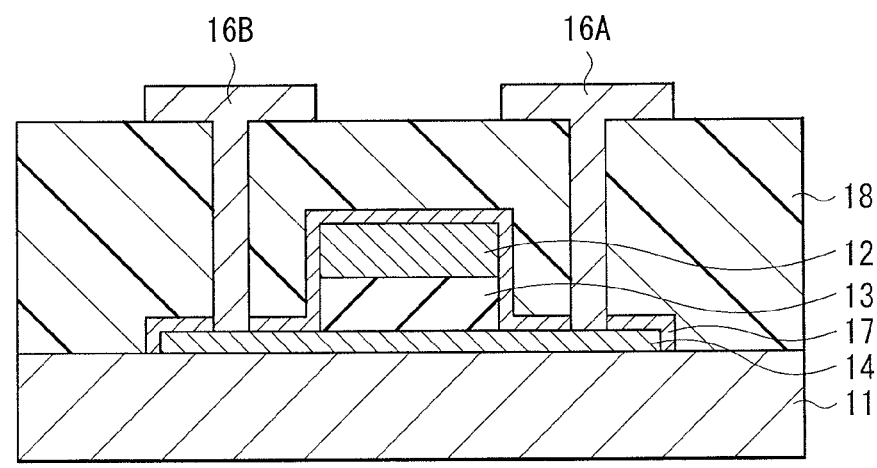
FIG. 11D is a cross-sectional view illustrating a step following the step shown in FIG. 11C.

Subsequently, as shown in FIG. 11D, the through holes 18A are formed that run through the planarization film 18 and the protection film 17 and arrive at the oxide semiconductor layer 14. Thereafter, a metal thin film that may include, for example, Ti, Al, and Ti laminated in this order is formed, for example, by sputtering so that the metal film covers the planarization film 18 and fills the through holes 18A. Lastly, the formed metal thin film is patterned by wet etching with use of mixture of phosphoric acid, nitric acid, and acetic acid to form the source-drain electrodes 16A and 16B. Thus, the TFT 20 is completed. It is to be noted that the gate insulating film 13 is formed in regions similar to those in FIG. 6.

The TFT 20 of the present embodiment has an effect of reducing source-drain capacity by having a top-gate structure, in addition to the effects of the above-described first embodiment. Therefore, the TFT 20 provides an effect that variation of a potential at the drain electrode 16B with respect to the variation of a potential at the gate electrode 16A is reduced.

4. Application Examples

Next, description will be given of examples in which the TFTs 10, 10A, 10B, and 20 of the above-described first and second embodiments and Modifications 1 and 2 are applied to an display unit and to an electronic apparatus.

Module and Application Examples

The above-described TFTs 10, 10A, 10B, and 20 may be used as a display unit in an electronic apparatus in any field that displays an externally-inputted or internally-generated image signal as an image or a moving picture, for example, a television, a digital camera, a notebook personal computer, an personal digital assistant such as a mobile phone, a video camcorder, or the like.

Module

Figure 12:
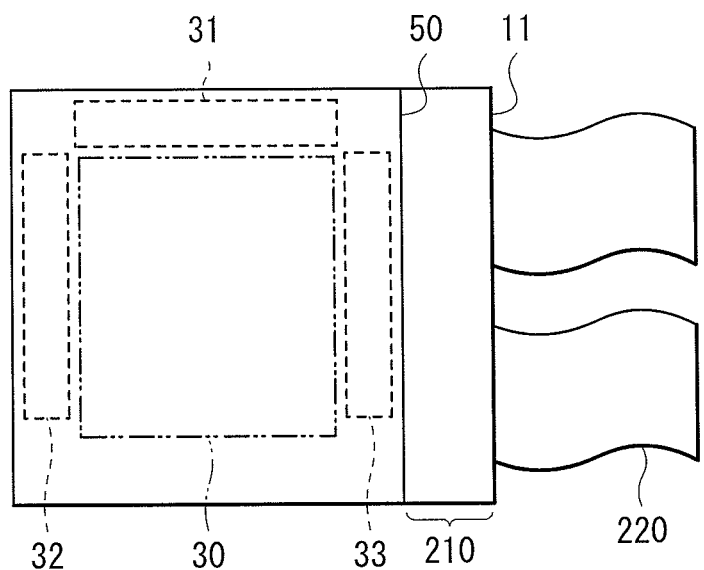
FIG. 12 is a planar view illustrating a schematic configuration of a module (display unit) that includes one of the foregoing TFTs.

For example, the above-described TFTs 10, 10A, 10B, and 20 may be assembled, as a module shown in FIG. 12, in various electronic apparatuses such as later-described Application Examples 1 to 5. The module may include, for example, a region 210 that is exposed from a sealing substrate 50 and from an adhesion layer (not illustrated) on a side of the substrate 11. Wirings of the horizontal selector 31, the write scanner 32, and the electric power source scanner 33 are extended to form external connection terminals (not illustrated) on the exposed region 210. A flexible printed circuit (FPC) 220 for input and output of signals may be provided in the external connection terminals.

Application Example 1

Figure 13:
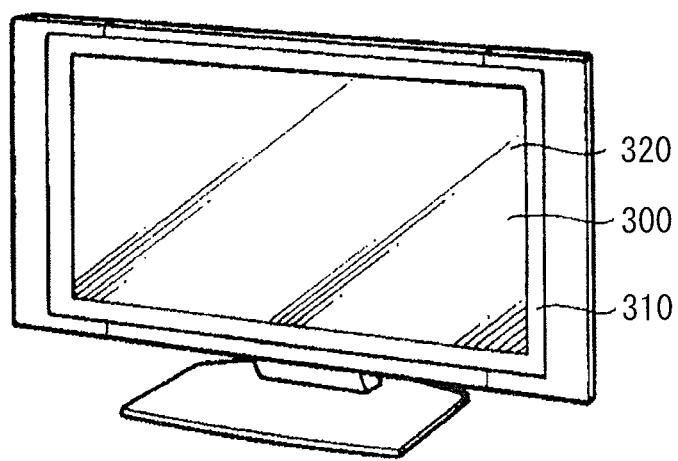
FIG. 13 is a perspective view illustrating an appearance of Application Example 1 of the foregoing display unit.

FIG. 13 illustrates an appearance of a television to which any of the above-described TFTs is applied. The television may include, for example, an image display screen section 300 that includes a front panel 310 and a filter glass 320. The image display screen section 300 is configured of a display unit that includes one of the TFTs 10, 10A, 10B, and 20 according to the above-described embodiments and the like.

Application Example 2

Figure 14A:
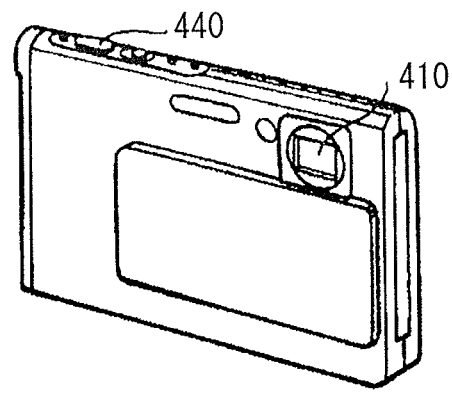
FIG. 14A is a perspective view illustrating an appearance of Application Example 2 seen from the front thereof.
Figure 14B:
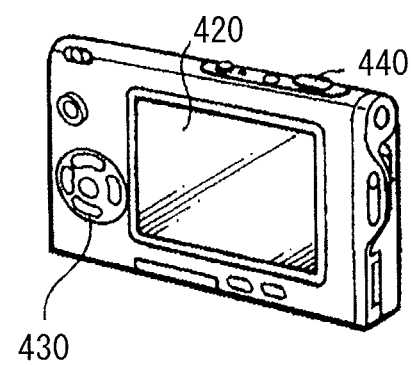
FIG. 14B is a perspective view illustrating an appearance of Application Example 2 seen from the back thereof.

FIGS. 14A and 14B each illustrate an appearance of a digital camera to which any of the above-described TFTs is applied. The digital camera may include, for example, a light emitting section 410 for flash, a display section 420, a menu switch 430, and a shutter button 440. The display section 420 is configured of a display unit that includes one of the TFTs 10, 10A, 10B, and 20 according to the above-described embodiments and the like.

Application Example 3

Figure 15:
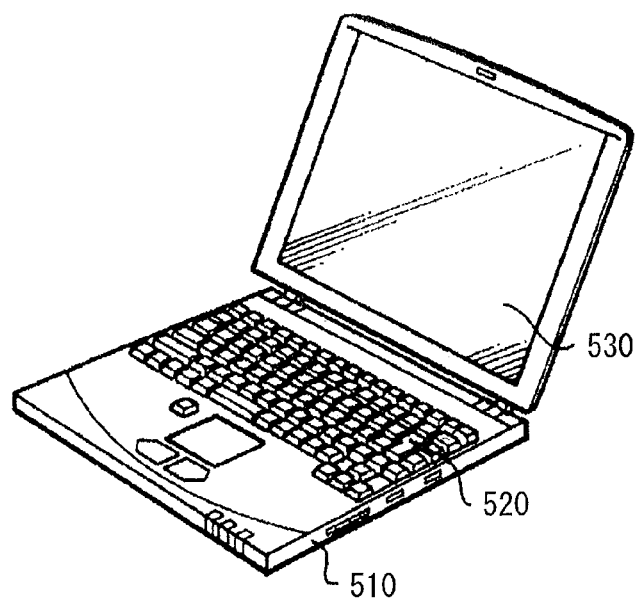
FIG. 15 is a perspective view illustrating an appearance of Application Example 3.

FIG. 15 illustrates an appearance of a notebook personal computer to which any of the above-described TFTs is applied. The notebook personal computer may include, for example, a main body 510, a keyboard 520 for operation of inputting characters etc., and a display section 530 that displays an image. The display section 530 is configured of a display unit that includes one of the TFTs 10, 10A, 10B, and 20 according to the above-described embodiments and the like.

Application Example 4

Figure 16:
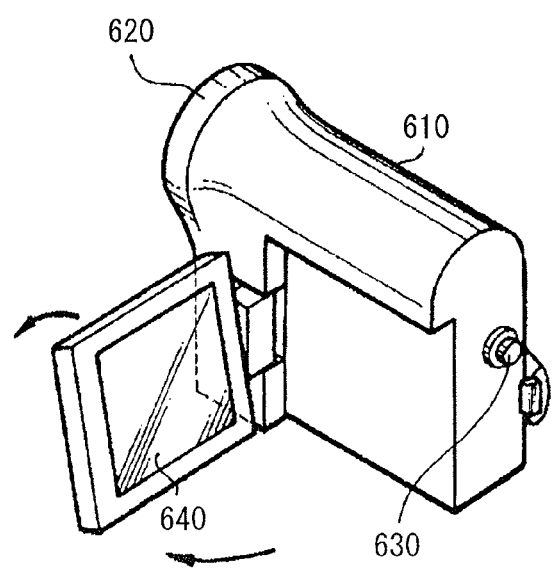
FIG. 16 is a perspective view illustrating an appearance of Application Example 4.

FIG. 16 illustrates an appearance of a video camcorder to which any of the above-described TFTs is applied. The video camcorder may include, for example, a main body section 610, a lens 620 for shooting a subject provided on a front side face of the main body section 610, a start-stop switch 630 used upon shooting, and a display section 640. The display section 640 is configured of a display unit that includes one of the TFTs 10, 10A, 10B, and 20 according to the above-described embodiments and the like.

Application Example 5

FIGS. 17A to 17G each illustrate an appearance of a mobile phone to which any of the above-described TFTs is applied. The mobile phone may include, for example, a top housing 710 and a bottom housing 720 connected with a connection section (hinge section) 730, and may include a display 740, a sub-display 750, a picture light 760, and a camera 770. The display 740 and the sub-display 750 are each configured of a display unit that includes one of the TFTs 10, 10A, 10B, and 20 according to the above-described embodiments and the like.

Description has been given of the TFT 10, 10A, 10B, and 20 of the preferred embodiments and the like. of the present disclosure with reference to the first and second embodiments and Modifications 1 and 2. However, the present disclosure is not limited to the above-described preferred embodiments and the like. The configurations of the TFTs 10, 10A, 10B, and 20 of the preferred embodiments and the like of the present disclosure and the manufacturing methods thereof, wiring patterns in the display unit 1, etc. may be freely modified as long as effects similar to those of the above-described embodiments are obtained.

For example, in the above-described embodiments and the like, In—Ga—Zn is used as a material of the oxide semiconductor layer 14. However, Al or Fe may be used instead of Ga. Further, in the above-described embodiments and the like, the source-drain electrodes 16A and 16B are configured of the tri-layer configured of [Ti/Al/Ti]. However, for example, a tri-layer configured of [Mo/Al/Mo] or [Ti/Al/Mo] may be used.

It is possible to achieve at least the following configurations from the above-described example embodiments and the modifications of the disclosure.

(1) A thin film transistor including:
a gate electrode and a pair of source-drain electrodes provided on a substrate;
an oxide semiconductor layer provided between the gate electrode and the pair of source-drain electrodes, the oxide semiconductor layer forming a channel;
a protection film provided over whole of a surface above the substrate; and
a gate insulating film provided on a gate electrode side of the oxide semiconductor layer, the gate insulating film having end faces part or all of which are covered with the pair of source-drain electrodes or with the protection film.
(2) The thin film transistor according to (1), wherein the gate electrode, the gate insulating film, the oxide semiconductor layer, the pair of source-drain electrodes, and the protective film are provided on the substrate in recited order.
(3) The thin film transistor according to (1), wherein the oxide semiconductor layer, the gate insulating film, the gate electrode, the protection film, and the pair of source-drain electrodes are provided on the substrate in recited order.
(4) The thin film transistor according to (2), wherein the pair of source-drain electrodes cover whole of the end faces and a surface exposed from the oxide semiconductor layer of the gate insulating film.
(5) A method of manufacturing a thin film transistor, the method including:
forming a gate electrode on a substrate;
forming a gate insulating film over whole of a surface above the substrate and the gate electrode;
forming an oxide semiconductor layer on the gate insulating film;
removing part of the gate electrode to form an end face;
forming a pair of source-drain electrodes from on the oxide semiconductor layer and to on the substrate; and
forming a protection film over whole of a surface above the substrate.
(6) A method of manufacturing a thin film transistor, the method including:
forming a gate electrode on a substrate;
forming a gate insulating film over whole of a surface above the substrate and the gate electrode;
forming an oxide semiconductor layer on the gate insulating film;
removing part of the gate electrode to form an end face;
forming a pair of source-drain electrodes on the oxide semiconductor layer; and
forming a protection film that is in contact with the end face of the gate insulating film and covers whole of a surface above the substrate.
(7) A method of manufacturing a thin film transistor, the method including:
forming an oxide semiconductor layer on a substrate;
forming a gate insulating film on the oxide semiconductor layer;
forming a gate electrode on the gate insulating film;
forming a protection film from on the gate electrode and to on the substrate; and
forming a pair of source-drain electrodes in a region where the gate electrode is not formed, the pair of source-drain electrodes being connected to the oxide semiconductor layer.
(8) A display unit with a plurality of display devices and a plurality of thin film transistors driving the display devices, the plurality of thin film transistors each including:
a gate electrode and a pair of source-drain electrodes provided on a substrate;
an oxide semiconductor layer provided between the gate electrode and the pair of source-drain electrodes, the oxide semiconductor layer forming a channel;
a protection film provided over whole of a surface above the substrate; and
a gate insulating film provided on a gate electrode side of the oxide semiconductor layer, the gate insulating film having end faces part or all of which are covered with the pair of source-drain electrodes or with the protection film.
(9) The display unit according to (8), wherein the gate insulating film is separated between adjacent thin film transistors of the plurality of thin film transistors.
(10) An electronic apparatus with a display unit with a plurality of display devices and a plurality of thin film transistors driving the display devices, the plurality of thin film transistors each including:
a gate electrode and a pair of source-drain electrodes provided on a substrate;
an oxide semiconductor layer provided between the gate electrode and the pair of source-drain electrodes, the oxide semiconductor layer forming a channel;
a protection film provided over whole of a surface above the substrate; and
a gate insulating film provided on a gate electrode side of the oxide semiconductor layer, the gate insulating film having end faces part or all of which are covered with the pair of source-drain electrodes or with the protection film.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:
1. A thin film transistor comprising:
a gate electrode and a pair of source-drain electrodes provided on a substrate;
an oxide semiconductor layer provided between the gate electrode and the pair of source-drain electrodes, the oxide semiconductor layer forming a channel;
a channel protective film formed on the channel of the oxide semiconductor layer;
a protection film provided over whole of a surface above the substrate, a portion of the channel protective film being formed between the protection film and the oxide semiconductor layer in a thickness direction of the thin film transistor; and
a gate insulating film provided on a gate electrode side of the oxide semiconductor layer, and configured of one of a single film and a lamination film, the lamination film including a plurality of films,
wherein the pair of source-drain electrodes cover the entire end faces of the single film of the gate insulating film or cover the entire end faces of each of the films in the lamination film of the gate insulating film, and cover at least part of each of a plurality of side faces of the gate insulating film.
2. The thin film transistor according to claim 1, wherein the gate electrode, the gate insulating film, the oxide semiconductor layer, the pair of source-drain electrodes, and the protective film are provided on the substrate in recited order.
3. The thin film transistor according to claim 2, wherein the pair of source-drain electrodes cover a surface exposed from the oxide semiconductor layer of the gate insulating film.

4. The thin film transistor according to claim 1, wherein the channel protective film has a width in plan view that is less than a corresponding width of the source and drain electrodes in plan view such that source and drain electrodes cover at least portions of at least three edge surfaces of the channel protective film.

5. The thin film transistor according to claim 1, wherein in plan view the gate electrode has a first width in an area not covered by the source and drain electrodes that is less than a second width in an area that is covered by the source and drain electrodes.

6. The thin film transistor according to claim 1, wherein the gate insulating film is patterned in an island-like shape.

7. A display unit with a plurality of display devices and a plurality of thin film transistors driving the display devices, the plurality of thin film transistors each comprising:
   a gate electrode and a pair of source-drain electrodes provided on a substrate;
   an oxide semiconductor layer provided between the gate electrode and the pair of source-drain electrodes, the oxide semiconductor layer forming a channel;
   a channel protective film formed on the channel of the oxide semiconductor layer;
   a protection film provided over whole of a surface above the substrate, a portion of the channel protective film being formed between the protection film and the oxide semiconductor layer in a thickness direction of the thin film transistor; and
   a gate insulating film provided on a gate electrode side of the oxide semiconductor layer, and configured of one of a single film and lamination film, the lamination film including a plurality of films,
   wherein the pair of source-drain electrodes cover the entire end faces of the single film of the gate insulating film or cover the entire end faces of each of the films in the lamination film of the gate insulating film, and cover at least part of each of a plurality of side faces of the gate insulating film.

8. The display unit according to claim 7, wherein the gate insulating film is separated between adjacent thin film transistors of the plurality of thin film transistors.

9. An electronic apparatus with a display unit with a plurality of display devices and a plurality of thin film transistors driving the display devices, the plurality of thin film transistors each comprising:
   a gate electrode and a pair of source-drain electrodes provided on a substrate;
   an oxide semiconductor layer provided between the gate electrode and the pair of source-drain electrodes, the oxide semiconductor layer forming a channel;
   a channel protective film formed on the channel of the oxide semiconductor layer;
   a protection film provided over whole of a surface above the substrate, and a portion of the channel protective film is formed between the protection film and the oxide semiconductor layer in a thickness direction of the thin film transistor; and
   a gate insulating film provided on a gate electrode side of the oxide semiconductor layer, and configured of one of a single film and a lamination film, the lamination film including a plurality of films,
   wherein the pair of source-drain electrodes cover the entire end faces of the single film of the gate insulating film or cover the entire end faces of each of the films in the lamination film of the gate insulating film, and cover at least part of each of a plurality of side faces of the gate insulating film.

* * * * *